(12) United States Patent
Karim et al.

(10) Patent No.: US 11,335,662 B2
(45) Date of Patent: May 17, 2022

(54) SOLDER REFLOW OVEN FOR BATCH PROCESSING

(71) Applicant: Yield Engineering Systems, Inc., Fremont, CA (US)

(72) Inventors: M Ziaul Karim, San Jose, CA (US); Randy Hall, Livermore, CA (US); Peter Krotov, Livermore, CA (US)

(73) Assignee: YIELD ENGINEERING SYSTEMS, INC., Fremont, CA (US)

( * ) Notice: Subject to any disclaimer, the term of this patent is extended or adjusted under 35 U.S.C. 154(b) by 0 days.

(21) Appl. No.: 17/464,863

(22) Filed: Sep. 2, 2021

(65) Prior Publication Data

US 2021/0398937 A1 Dec. 23, 2021

Related U.S. Application Data

(63) Continuation of application No. 16/851,977, filed on Apr. 17, 2020.
(Continued)

(51) Int. Cl.
| | |
|---|---|
| *B23K 1/00* | (2006.01) |
| *H01L 23/00* | (2006.01) |
| *B23K 1/008* | (2006.01) |
| *B23K 1/005* | (2006.01) |
| *B23K 101/40* | (2006.01) |

(52) U.S. Cl.
CPC ............. *H01L 24/75* (2013.01); *B23K 1/008* (2013.01); *B23K 1/0053* (2013.01); *H01L 24/81* (2013.01); *H01L 24/95* (2013.01); *B23K 2101/40* (2018.08); *H01L 2224/755* (2013.01); *H01L 2224/7598* (2013.01); *H01L 2224/75102* (2013.01); *H01L 2224/75272* (2013.01); *H01L 2224/75283* (2013.01); *H01L 2224/75901* (2013.01); *H01L 2224/8109* (2013.01);
(Continued)

(58) Field of Classification Search
CPC ........ H01L 21/67757; H01L 21/67098; H05B 3/62; H05B 6/02
See application file for complete search history.

(56) References Cited

U.S. PATENT DOCUMENTS

| | | |
|---|---|---|
| 4,597,736 A | 7/1986 | Moffat |
| 5,516,283 A | 5/1996 | Schrems |
| (Continued) | | |

FOREIGN PATENT DOCUMENTS

| | | |
|---|---|---|
| TW | 108105189 | 10/2019 |
| WO | WO 2019/099401 | 5/2019 |
| WO | WO 2019/161109 | 8/2019 |

*Primary Examiner* — Erin B Saad
(74) *Attorney, Agent, or Firm* — Finnegan, Henderson, Farabow, Garrett & Dunner, LLP (57) ABSTRACT

A solder reflow oven may include a reflow chamber and a plurality of vertically spaced apart wafer-support plates positioned in the reflow chamber. A plurality of semiconductor wafers each including a solder are configured to be disposed in the reflow chamber such that each semiconductor wafer is disposed proximate to, and vertically spaced apart from, a wafer-support plate. Each wafer-support plate may include at least one of liquid-flow channels or resistive heating elements. A control system control the flow of a hot liquid through the channels or activate the heating elements to heat a wafer to a temperature above the solder reflow temperature.

13 Claims, 6 Drawing Sheets

Related U.S. Application Data (60) Provisional application No. 62/981,441, filed on Feb. 25, 2020.

(52) U.S. Cl.
CPC ............. *H01L 2224/8121* (2013.01); *H01L 2224/81815* (2013.01); *H01L 2224/81908* (2013.01)

(56) References Cited

U.S. PATENT DOCUMENTS

| | | |
|---|---|---|
| 5,525,780 A | 6/1996 | Moslehi |
| 5,662,470 A | 9/1997 | Huussen et al. |
| 6,059,567 A * | 5/2000 | Bolton ............. H01L 21/67109 432/152 |
| 6,198,075 B1 | 3/2001 | Moffat |
| 6,225,602 B1 | 5/2001 | Buijze et al. |
| 6,780,225 B2 | 8/2004 | Shaw et al. |
| 8,361,548 B2 | 1/2013 | Moffat et al. |
| 10,147,616 B2 | 12/2018 | Moffat et al. |
| 10,490,431 B2 | 11/2019 | Moffat et al. |
| 2007/0167026 A1 | 7/2007 | Miura |
| 2008/0023141 A1 | 1/2008 | Shimizu et al. |
| 2009/0145890 A1 | 6/2009 | Matsuura et al. |
| 2012/0000425 A1 | 1/2012 | Park et al. |
| 2012/0067521 A1 | 3/2012 | Shimomura et al. |
| 2019/0314738 A1 | 10/2019 | Moffat et al. |
| 2020/0013591 A1 | 1/2020 | Moffat et al. |

\* cited by examiner

SOLDER REFLOW OVEN FOR BATCH PROCESSING

CROSS-REFERENCE TO RELATED APPLICATION

This application a continuation of U.S. application Ser. No. 16/851,977, filed Apr. 17, 2020, which claims priority to U.S. Provisional Application No. 62/981,441, filed Feb. 25, 2020, the entireties of which are incorporated herein by reference.

TECHNICAL FIELD

The present disclosure relates to heterogeneous integration, assembly, and packaging of integrated circuits in general, and flux-less solder reflow process and tools in particular, especially in vertical batch processing of wafers.

BACKGROUND

Semiconductor wafer packaging involves many complicated tools and procedures. Some of the tools and processes have been disclosed in previously filed patents/published patent applications, e.g., U.S. Pat. No. 4,597,736 ("Method and apparatus for heating semiconductor wafers"), U.S. Pat. No. 6,198,075 ("Rapid heating and cooling vacuum oven"), U.S. Pat. No. 10,147,617 ("Method for the rapid processing of polymer layers in support of imidization process and fan out wafer level packaging including efficient drying of precursor layers"), U.S. Pat. No. 10,490,431 ("Combination vacuum and over-pressure process chamber and methods related thereto"), US 2019/0314738 ("Trap assembly and system for trapping polymer vapors in process oven vacuum systems"), and US 2020/0013591 ("Plasma spreading apparatus and system, and method for spreading plasma in process oven").

Reflow soldering is a process in which a solder paste is used to attach one physical component to another physical component in an electronic circuit, after which the entire assembly is subjected to controlled heat to make a permanent bond between the components. Traditional solder reflow ovens have a horizontal configuration with in-line wafer transfer in the horizontal direction. This introduces a lot of complexities, such as uneven heat distribution, contamination, and lower throughput, while performing flux-less reflow of solder in advanced packaging applications. Additionally, the traditional horizontal solder reflow ovens have a large footprint and wafer-to-wafer variation.

A vertical oven with multiple wafers has the advantage of lower footprint, higher throughput and good temperature control. What is needed is modification of the existing vertical ovens to suit flux-less solder reflow process to allow soldering of metal parts with surface oxides for high quality wetting of the solder to metals to get void-free solder joints.

SUMMARY

The following is a simplified summary of the disclosure in order to provide a basic understanding of some aspects of the disclosure. This summary is not an extensive overview of the disclosure. It is intended to neither identify key or critical elements of the disclosure, nor delineate any scope of the particular implementations of the disclosure or any scope of the claims. Its sole purpose is to present some concepts of the disclosure in a simplified form as a prelude to the more detailed description that is presented later.

Aspects of the disclosure describe methods and systems for flux-less solder reflow process performed on a batch of wafers with solder bumps thereon inside a vertical oven. The vertical oven comprises a reflow chamber inside which the batch of wafers is loaded, the reflow chamber housing a plurality of wafer-support plates, each wafer-support plate holding a respective wafer of the batch of wafers in a contactless manner. The vertical oven also comprises a first port to bring the reflow chamber to a vacuum or near-vacuum level after the batch of wafers are loaded and the reflow chamber is sealed from atmosphere; a second port to introduce a non-reactive gas into the reflow chamber after the reflow chamber is brought down to the vacuum or the near-vacuum level, wherein the non-reactive gas brings the reflow chamber to a predetermined sub-atmospheric pressure customized for the flux-less solder reflow process; and, a third port to inject a reducing agent into the reflow chamber, wherein a predetermined laminar flow of the reducing agent inside the reflow chamber assists the flux-less solder reflow process. Further, the vertical oven comprises a temperature control mechanism for controlled ramping up of temperature for the solder reflow to occur uniformly across all the wafers in the batch of wafers, and for controlled ramping down of temperature uniformly across all the wafers in the batch of wafers after the solder reflow has occurred.

The temperature control mechanism may be based on flow of high-temperature thermal transfer fluid in one embodiment. In another embodiment, the temperature control mechanism may be based on specially designed infrared heaters with independent zone control capabilities.

Corresponding methods of effectively perform a solder reflow process in the specially designed vertical oven are also claimed.

BRIEF DESCRIPTION OF THE DRAWINGS

The present disclosure will be understood more fully from the detailed description given below and from the accompanying drawings of various implementations of the disclosure. Please note that the dimensions shown in the figures are for illustrative purposes only and not drawn to scale.

DETAILED DESCRIPTION

Aspects of the present disclosure are directed to compact vertical oven for reflow of solder bumps for backend processes in semiconductor wafer assembly and packaging that results in void-free solder joints. The backend processes include but are not limited to wafer-to-wafer interconnect bonding anneal and degas/bake before physical vapor deposition (PVD) metallization with possible extension to underfill and environmental molding cure/anneal in heterogeneous integration that encompasses metal-to-polymer wafer bonding. Though formic acid is described as an illustrative example of reducing agent for flux-less soldering, the systems and methods described herein are effective for other reducing agents as well as long as the reducing agent is introduced in a fluidic (gas/liquid) form. The reducing agent may also be referred as process gas. Also, the materials of the solder may vary, but the oven is versatile enough to handle different types of solder. Most of the solders are lead-free. Tin (Sn)-based solders are common for flux-less processes, and example being gold-tin (AuSn) solder.

As mentioned in the background section, traditional solder reflow ovens have an established formic acid (or other reducing agent) reflow process where wafer transfer occurs in a horizontal direction. This process has significant drawbacks, such as very large footprint, high consumption of energy, excessive contamination, and lower throughput.

This disclosure is to address those issues by designing a vertical oven which uses a plurality of wafers (e.g., an example value is 50-100 wafers) in a batch with controlled injection of the reducing agent (e.g., formic acid), resulting in a process largely free of contamination.

This disclosure describes controlled formic acid flow through a vertical system using laminar flow technology in a sub-atmospheric pressure environment, which is not currently available in the industry. The efficacy of the process depends on effective formic acid vapor delivery, integrated temperature control during heating and cooling, and careful design of the vapor flow path with exhaust. Zone-dependent reaction dynamics managed by vapor delivery process, two-steps temperature ramp control, and controlled cooling process and formic acid content ensures the effective reaction without any flux.

Persons skilled in the art would understand, in view of the current specification, that there are many possible configurations of the solder reflow oven to achieve the above-stated goals of effective vertical batch processing. Below two of the possible embodiments are described in somewhat greater detail, while other modifications are within the scope of the disclosure.

Example Embodiment #1: Panels Heating and Cooling Using High Temperature Thermal Transfer Fluid (HTF)

Figure 1:
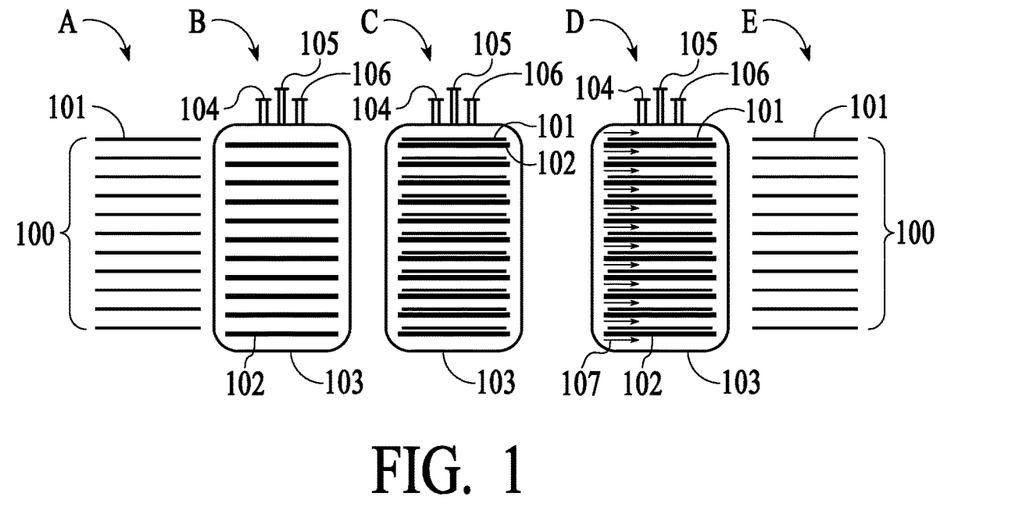
FIG. 1 illustrates steps of processing a batch of wafers in a reflow chamber in a vertical oven, according to an embodiment of the present disclosure.

As shown in FIG. 1, diagram "A" shows a cassette 100 that is loaded with a stack of wafers/wafer-holding panels (101) in a vertical configuration. The number of wafers can be any arbitrary number based on the capacity of the cassette. In diagram "B", a reflow chamber 103 is shown. The reflow chamber 103 has built-in stack of heating/cooling plates 102. The number of heating/cooling plates 102 is greater than or equal to the number of panels 101. The chamber 103 also has vacuum port (104), acid port (105) and gas port (106). For example, formic acid is injected via port 105 when certain temperature and vacuum level are reached. Controlled rate heating can be done either in vacuum or in a non-reactive gas environment, such as helium, nitrogen, argon, hydrogen etc. Diagram "C" shows that the cassette loaded with the wafers 101 is inserted within a reflow chamber 103, so that each wafer/panel (101) is adjacent to its corresponding heating/cooling plate 102 within the chamber 103. Diagram "D" shows controlled rate cooling. Optionally, cooling gas flow 107 can be introduced in the chamber 103. The cooling gas flow can use forced convection or other methods. Diagram "E" shows the cassette 100 is taken out of the chamber 103 after the reflow process is completed.

The cassette 100 can be loaded in the chamber 103 whose door (not shown) can be closed/sealed after loading and a vacuum condition is achieved (or non-reactive gas is injected in the chamber). Alternatively, the chamber racks may be robotically loaded with wafers/panels 101. Electrical connections (not shown) enable mounting of thermocouples. Chamber also has external/internal wall heaters to keep walls at certain temperature to reduce heat losses from the side areas of the wafers/panels to the wall when the wafers/panels are heated up. This reduces wafer/panel temperature non-uniformity.

Within the chamber 103, the heating/cooling plates 102 may have a predefined vertical separation (e.g., 15-50 mm). The wafers/panels 101, retained by the cassette 100, are parallel and adjacent to the heating/cooling plates 102 and are kept at a certain distance from the plates to prevent formation of hot/cold zones that is likely to be created when the wafers/panels 101 touch the heating/cooling plates 102 because of warpage.

Figure 2:
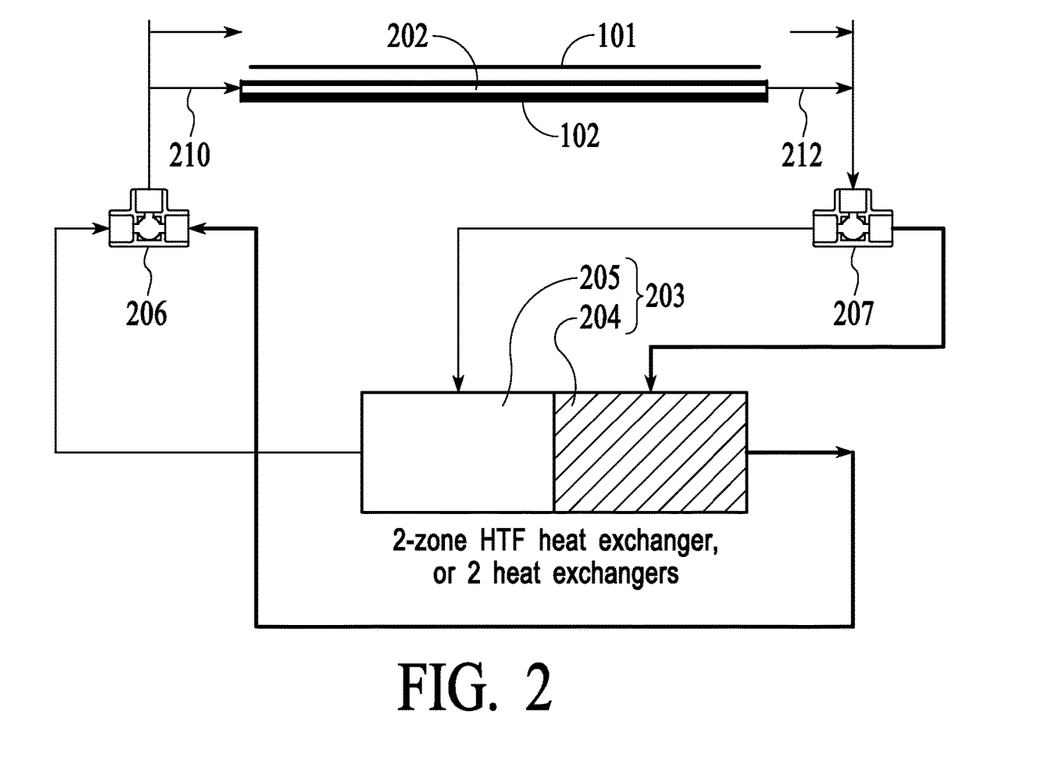
FIG. 2 illustrates the concept of heating and cooling wafers/panels using high temperature thermal transfer (HTF) fluid, according to a first embodiment of the present disclosure.

FIG. 2 shows a single heating/cooling plate 102 of the stack of heating/cooling plates shown in FIG. 1 to show that each heating/cooling plate 102 has a built-in channel 202 inside where hot/cold fluid comes in at one end 210 and hot/cold fluid comes out at the other end 212. The hot/cold fluid can be thermal transfer fluid (HTF), such as synthetic oil, Galden etc. that flow through the channels for heating/cooling purposes. The chamber can be kept at vacuum or filled with other non-reactive gases (e.g., nitrogen, helium, Argon etc.) to a certain pressure that improves heat transfer between the heating/cooling plates 102 and the wafers/panels 101. The chamber may have gas manifolds inside to flow cold or heated gas across the wafers/panels 101 in order to speed up heating/cooling by introducing forced convection, and/or to assist in improving temperature uniformity across the wafers/panels 101 that may have been caused by wafer/panel warpage or any other reason.

The hot heat transfer fluid is pumped thru the heating/cooling plates to initiate heating of the wafers/panels by radiation, and/or also by convection and conduction heat transfer mechanism if the chamber has gas inside. The HTF temperature and flow rate may be adjusted to control the panels/wafers heat-up rate, or to stop heating when it is required by the process. Two 3-way valves 206 and 207 (or any other hardware that assist with maintaining the required fluid temperature) can switch between cold/hot fluid though the channel 202. The cold/hot fluids come from the two zones 205 and 204 of a two-zone HTF heat exchanger 203. Alternatively, 203 can be a combination of two heat exchangers instead of a single two-zone heat exchanger. In yet another alternative, 203 can be a heat exchanger with hot HTF and is coupled to a chiller that recirculates cold or warm fluid (30-45° C. are typical but other ranges are possible). Generically, the term "heat exchanger 203" encompasses all of these configurations.

Each heating/cooling plate 102 has two independent passages to separately flow hot and cold HTF through the same plate. This is shown in greater detail in FIGS. 3A and 3B (longitudinal cross sectional view and top view respectively).

The heating/cooling plate liquid inlets are connected to the heat exchanger 203. The HTF flow rate thru the cooling/heating plates may be adjusted by bypassing portion of the fluid back to a heat exchanger 203. Maintaining required temperature of the heating/cooling plates 102 can be achieved by mixing hot and cold HTF or by pumping hot and cold HTFs thru the heating/cooling plates simultaneously with different flow rates to maintain desired temperature.

Heating/cooling plates 102 may be any shape and made from any suitable material, as long as the material has a good heat transfer coefficient and an appropriate emissivity for better heat transfer via radiation.

The heating/cooling plates 102 may have textured surface, or extruded type of surface to increase surface area in order to improve heat transfer. The plates' surface may have coating to prevent plate material from chemical attack by process gases (i.e., formic acid that may result in particle creation and plate damage).

Figure 3A:
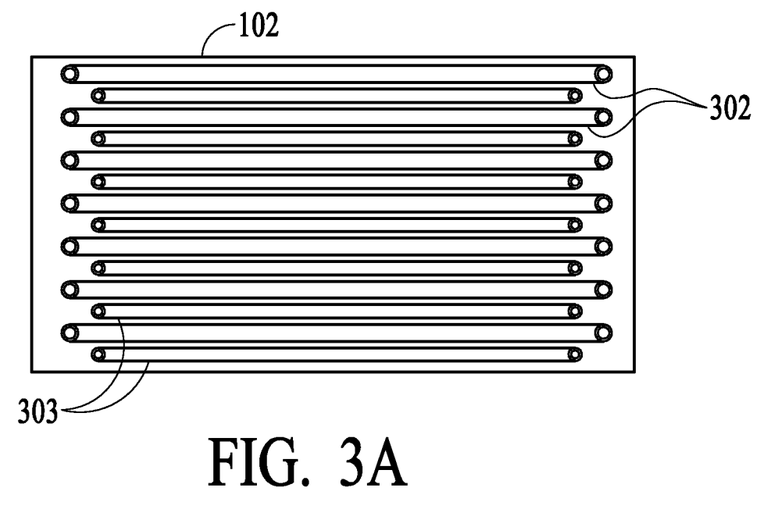
FIGS. 3A and 3B respectively illustrate the longitudinal cross-sectional view and top view of a heating/cooling plate, according to the first embodiment of the present disclosure.
Figure 3B:
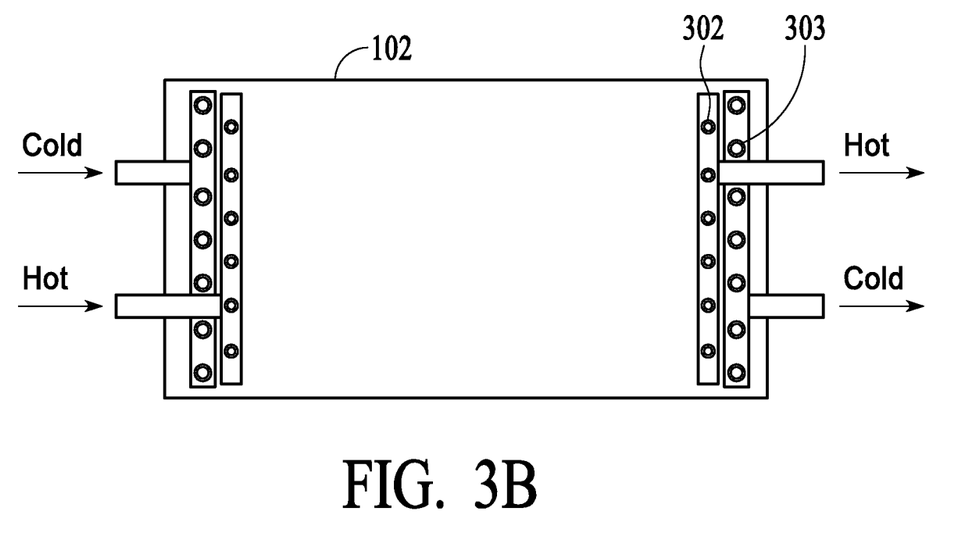

The heating/cooling plates' internal channels may be any shape and any size to optimize heat transfer and uniform heating of the wafers/panels, which will result in fast and controlled heating/cooling ramp rates of the panels/wafers. One of the plates' design approaches is shown in FIGS. 3A and 3B. The plate has numerous channels for hot and for cold HTFs. Hot fluid channels are shown as 302 and cold fluid channels are shown as 303. There is a separation between the hot fluid and cold fluid channels. Alternatively, the heating/cooling plates 102 may have a single set of channels for both hot and cold HTF supplied by the heat exchanger 203.

In yet another alternative embodiment, the heating/cooling plates for HTF can be replaced with, for example, ceramic resistive heating elements for heating only. Cooling in this case can be done with a gas flowing across the panels.

Temperature of the wafer/panel 101 may be monitored by any known method, and when temperature is reached required value (e.g., 150-180° C.), the process gas (e.g., formic acid) can be injected inside the chamber 103 for being soaked by the wafers/panels to remove oxides. At this point, the wafer/panels' heating rate may be reduced to certain value (can even be reduced to zero) to control the chemical reaction involving the process gas.

After certain time (e.g., ~80 sec), the heating with high rate may be resumed to reach temperature required for the reflow process (e.g., 232-265° C.).

At certain time, the hot HTF flow is stopped and the cold HTF starts flowing thru the heating/cooling plates 102 to cool panels down with the controlled rate. At this stage the wafers/panels 101 radiate energy back to the cold heating/cooling plates 102.

During cooling cycle, a gas at certain pressure may be introduced into the chamber to speed up cooling, and/or to reduce temperature non-uniformity among the wafers/panels. If desired, the chamber may have gas manifolds to flow gas across the wafers/panels to speed up cooling by forced convection. For reflow processes, any gas (except reactive gases like oxygen) can be used for cooling purpose. To reduce gas consumption, gas can be recirculated through a chiller or a cooling tower.

After wafer/panel temperature is below a certain value (e.g., 82° C.), the chamber can be vented to atmosphere and the cassette with the wafers/panels can be removed from the chamber.

In order to increase throughput, the cassette with wafers/panels can be removed from the chamber when the wafers/panels are still hot, and put into a buffer station in a non-reactive gas (e.g., N2) environment to complete cooling to a temperature when they can be safely exposed to atmosphere and removed from the module. This hardware may be connected to equipment front end module (EFEM) to load/unload front-opening unified pods (FOUPs).

Figure 4:
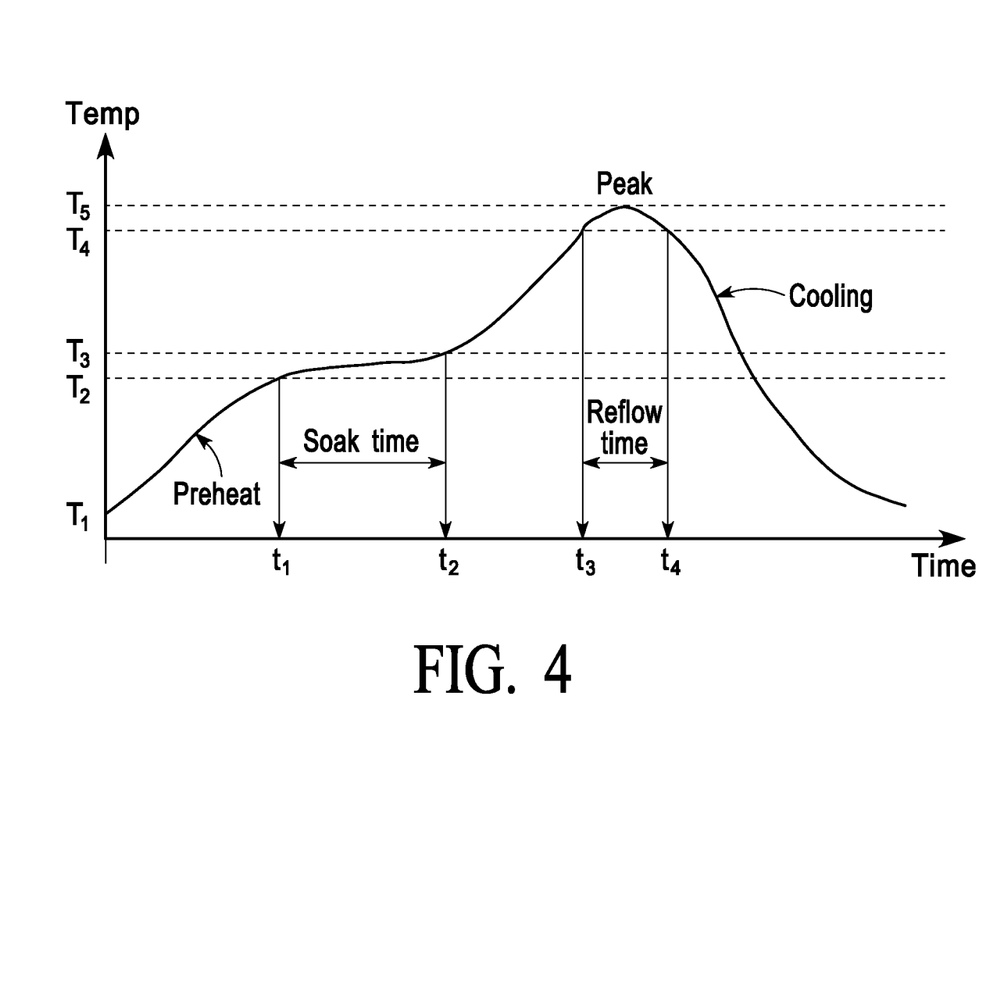
FIG. 4 illustrates a schematic plot to show a flux-less solder reflow process, according to embodiments of the present disclosure.

FIG. 4 shows a time versus temperature profile of a typical solder reflow process, where the liquidus temperature is between T4 and T5 within the reflow time (from t3 to t4). The design of the vertical chamber of this disclosure makes it possible to control the temperature ramps of this plot accurately.

Some of the major advantages of the proposed concept include but are not limited to a single chamber operation for heating and cooling, to perform reflow process; and the wafers/panels being parallel to the heating/cooling plates, resulting in very efficient heat transfer by radiation/convection, and reduction in wafer/panel temperature non-uniformity.

A single process chamber translates to reduced footprint, reduced cost of the hardware, reduced complexity and increased reliability of the system, and the possibility of changing heating and cooling ramp rates almost instantaneously to follow the reflow process requirements. This is a vast improvement over current state-of-the-art conventional reflow ovens that comprise multiple chambers (up to 12) for different processing stages, and therefore occupy a lot of factory/fab floor space for a throughput that is lower than what is achievable by the reflow oven disclosed here.

Figure 5A:
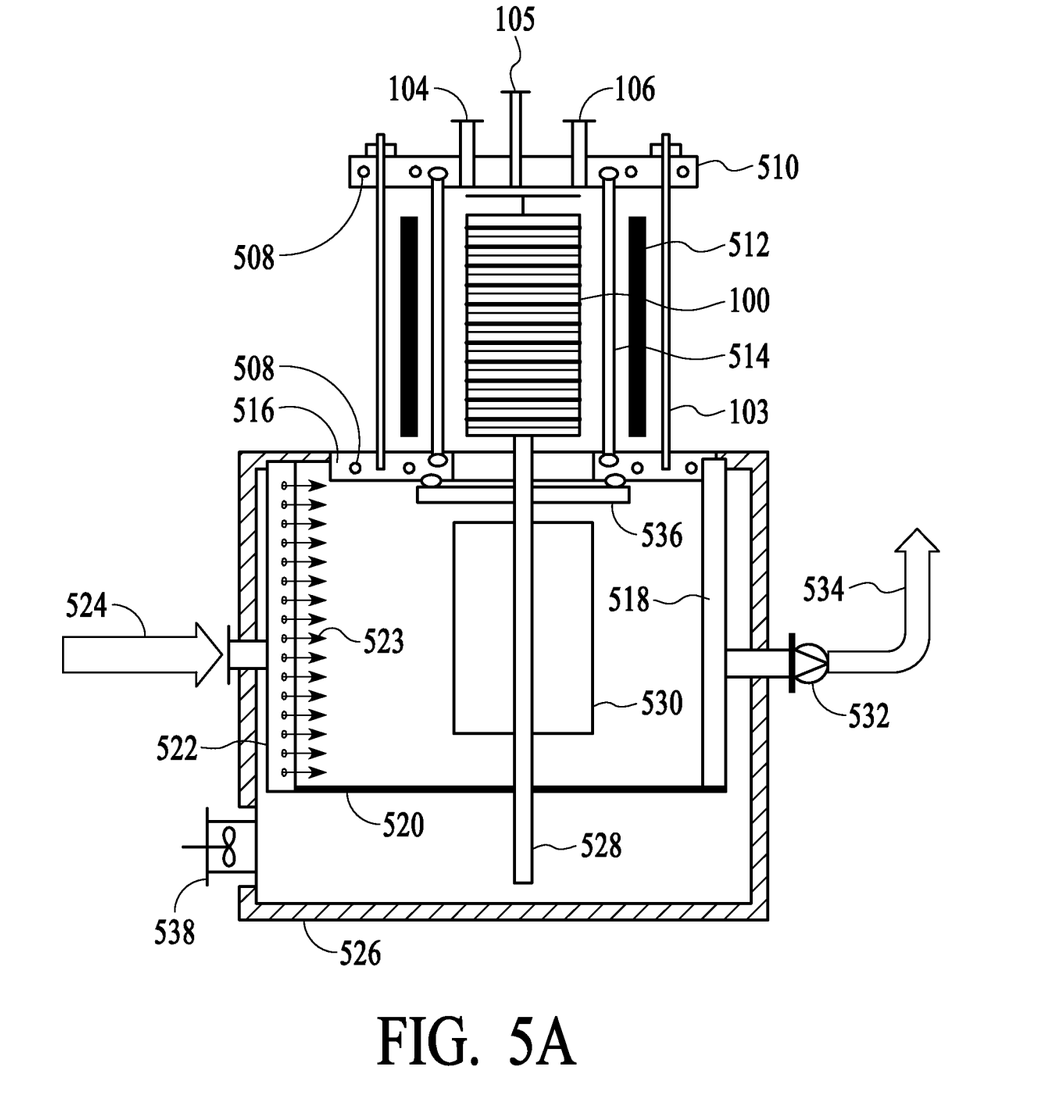
FIGS. 5A and 5B respectively illustrate the concept of heating panels with infra-red (IR) radiation and cooling in a separate zone within the chamber, according to a second embodiment of the present disclosure.

Method and Apparatus #2: Panels Heating with Infrared Radiant Heaters and Cooling in a Separate Zone An alternative design of the vertical oven has two separate zones for heating and cooling the wafers/panels. As shown in FIG. 5A, wafers/panels are loaded on a cassette 100 (similar to what is described in FIG. 1) and the cassette 100 is moved into the sealed enclosure 520 inside a frame 526. The sealed enclosure 520 may have gas manifolds 522 to flow gas to purge the enclosure of oxygen before cassette cooling. The cassette 100 may have susceptors between the wafers/panels to achieve uniform heating. The cassette loaded with the wafers/panels into the sealed enclosure 520 is lifted into a reflow chamber 103 (similar to what is shown in FIG. 1) using a door lift assembly 528.

The reflow chamber 103 comprises a quartz tube 514, top plate 510, bottom plate 516 and has cooling channels 508 (e.g., to protect O-rings and to prevent parts from overheating), and a temperature measurement device (not shown).

There is an infrared (IR) radiant heating structure 512 around the walls of the chamber 103, as shown in the top view (diagram A of FIG. 6), to heat up the wafers/panels 101 in a controlled manner. Number of IR heaters is shown as four in FIG. 6, but it can be any arbitrary numbers. The distance 'd' of the heater from the edge of the panel 101 and the width 'w' of the heater, as shown in the top view (diagram A of FIG. 6), as well as the height of the heater 'h' as shown in the side view (diagram B of FIG. 6) are design parameters that can be varied. Each heater may have independently controlled zones (such as zones 1, 2, 3 as shown in diagram "C" of FIG. 6) to improve temperature uniformity of the wafers/panels. The door 536 is in the up position (FIG. 5A) or down position (FIG. 5B) depending on whether the cassette 100 is in the reflow chamber 103 or in the cool-down chamber 520.

Reflow chamber 103 is sealed and pumped down to remove water vapor on the wafers/panels. This may take multiple cycles. N2 or other gas may be pumped into the chamber to help with the vapor removal. Multiple cycles may be required. O2 levels will be monitored to verify correct O2 levels are achieved. N2 may be pre-heated to speed up the vapor removal process. Chamber may be filled with gas to improve panels/wafers temperature uniformity.

Radiant heaters 512 are set to target temperature and the wafers/panels start heating with the controlled heating up rate. If necessary, the heating can be paused to wait until panels/wafers are in the desired temperature range required by the process.

Figure 5B:
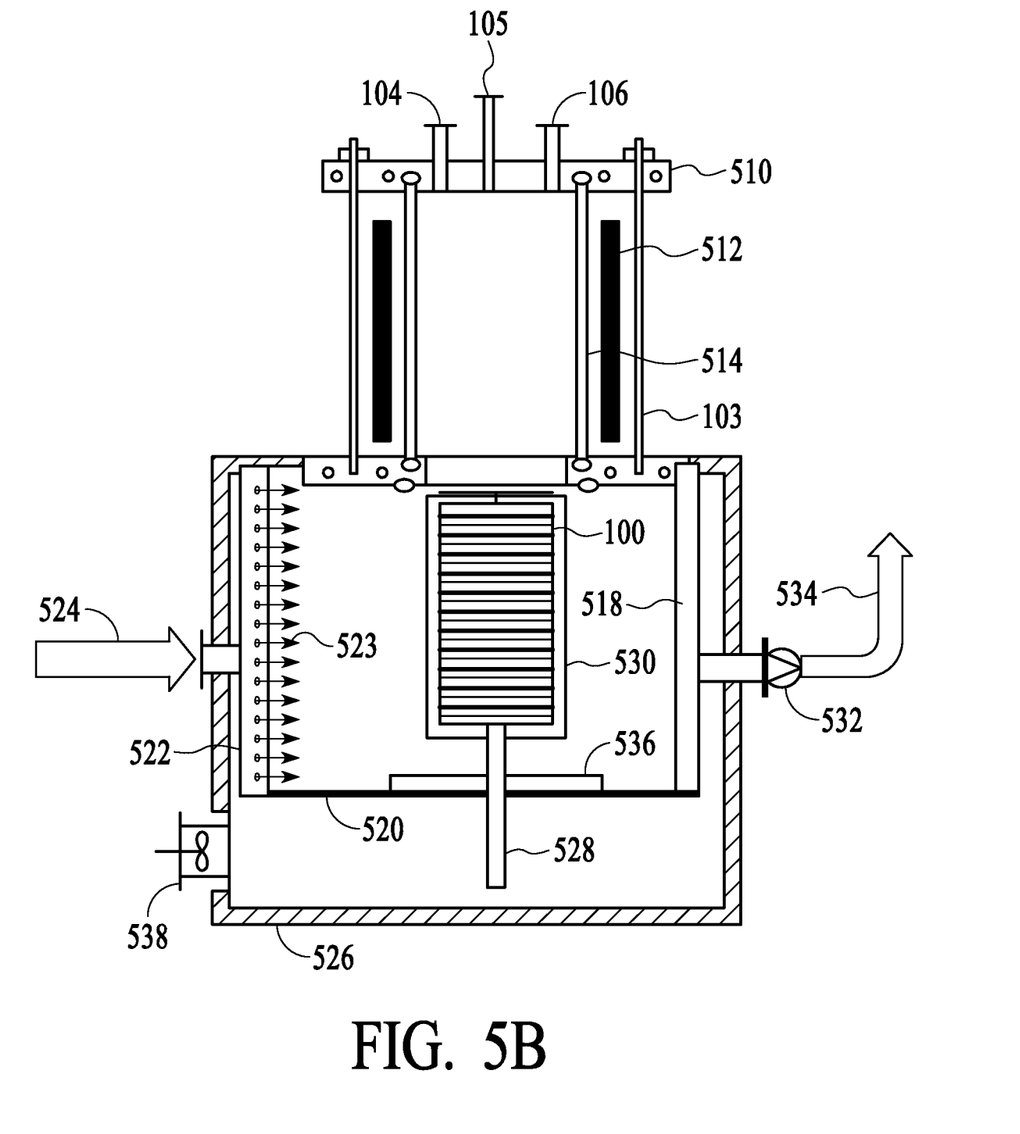
Figure 6:
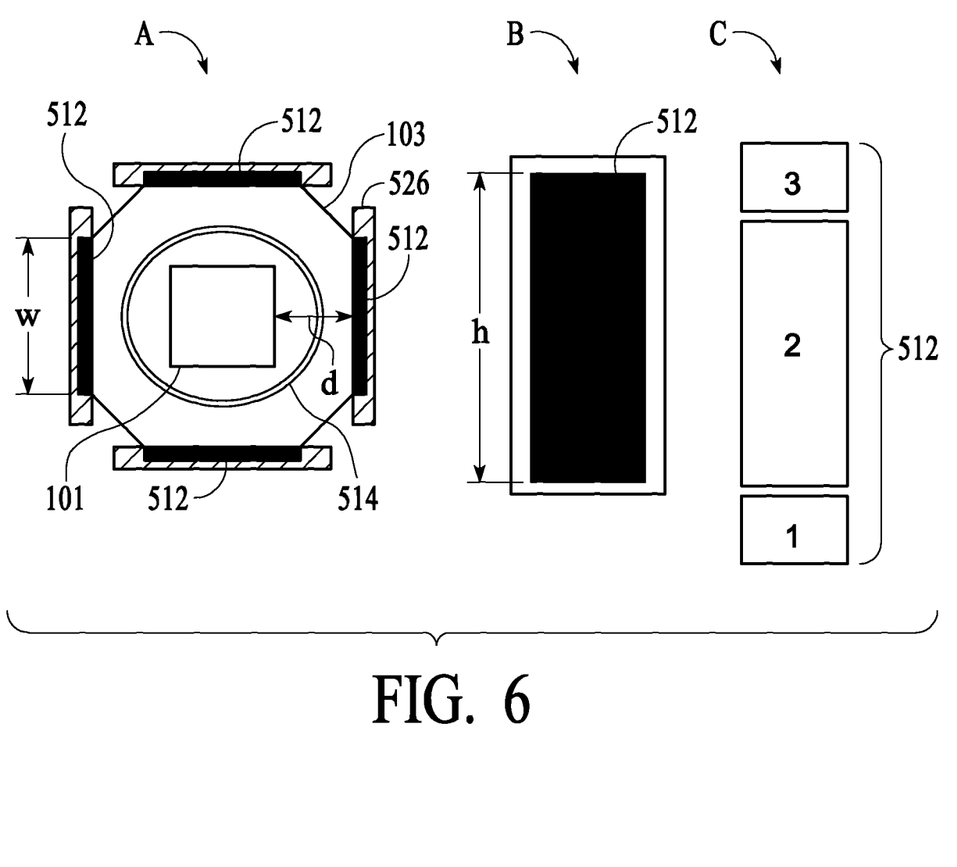
FIG. 6 schematically illustrates different views of the IR heater arrangement around the heating chamber, according to the second embodiment of the present disclosure.

After the reflow process completed, the heaters 512 are turned off (as shown in FIG. 5B), chamber 103 is vented and cassette 100 is moved down into the area 530 within the air-tight enclosure 520 with N2 environment.

The wafers/panels are cooled down with incoming N2 gas 524 flowing across the wafers/panels in a controlled manner. The outgoing N2 gas 534 can be recirculated thru the chiller, or exhausted to atmosphere (using the release valve 532). Instead of N2, other non-reactive gases (such as Ar) can be used too. The sealed enclosure 520 may have a N2 collector 518 and optionally a fan 538 to cool down the walls of the enclosure 520. After a cool down is complete, cassette 100 is unloaded from the enclosure 520 and new cassette is loaded to repeat the solder reflow process.

Advantages of the current design and method include but are not limited to separation of the heating and cooling zones resulting in high heat up and cool down rates; and better temperature control via the infrared heaters (e.g., IR heaters can be turned on/off, or set to desired temperature per the process requirements almost instantaneously).

Note that though the overall volume of this design with separate heating and cooling zones is bigger than the first embodiment shown in FIG. 2, the footprint still remains small as it is still a vertical configuration rather than a horizontal configuration, and a controlled profile as shown in FIG. 4 is easily achievable. The biggest advantage in both the designs is achieving ramp rates and control that is significantly greater (e.g., ten times or more) than current state-of-the-art design using horizontal atmospheric furnaces or even currently available vertical furnaces.

In the foregoing specification, implementations of the disclosure have been described with reference to specific example implementations thereof. It will be evident that various modifications may be made thereto without departing from the broader spirit and scope of implementations of the disclosure as set forth in the following claims. The specification and drawings are, accordingly, to be regarded in an illustrative sense rather than a restrictive sense. Additionally, the directional terms, e.g., "top", "bottom" etc. do not restrict the scope of the disclosure to any fixed orientation, but encompasses various permutations and combinations of orientations.

What is claimed is:

1. A solder reflow oven, comprising:
    a reflow chamber;
    a plurality of wafer-support plates positioned in the reflow chamber, wherein adjacent wafer-support plates of the plurality of wafer-support plates are vertically spaced apart from each other, and wherein a plurality of semiconductor wafers each including a solder are configured to be disposed in the reflow chamber such that each semiconductor wafer of the plurality of semiconductor wafers is disposed proximate to and vertically spaced apart from a wafer-support plate of the plurality of wafer-support plates, and wherein each wafer-support plate includes one or more channels configured to direct a liquid therethrough;
    a first port configured to direct a non-reactive gas into the reflow chamber;
    a second port configured to direct a reducing agent into the reflow chamber;
    a vacuum port configured to exhaust gases from the reflow chamber; and
    a control system configured to control a flow of a hot liquid through the one or more channels of each wafer-support plate to heat a semiconductor wafer of the plurality of semiconductor wafers disposed proximate to the wafer-support plate to a temperature above a reflow temperature of the solder on the semiconductor wafer.

2. The oven of claim 1, wherein the control system is further configured to control the flow of a cool liquid through the one or more channels of each wafer-support plate to cool the semiconductor wafer disposed proximate to the wafer-support plate to a temperature below the reflow temperature of the solder on the semiconductor wafer.

3. The oven of claim 2, wherein the one or more channels of each wafer-support plate includes a first set of channels and a second set of channels independent from the first set of channels, wherein the first set of channels is configured to direct the hot liquid through the first set of channels, and the second set of channels is configured to direct the cool liquid through the second set of channels.

4. The oven of claim 1, wherein adjacent wafer-support plates of the plurality wafer-support plates are vertically spaced apart from each other by 15-50 mm.

5. The oven of claim 1, wherein each wafer-support plate of the plurality of wafer support plates further includes one or more resistive heating elements.

6. The oven of claim 1, wherein a wall of the reflow chamber includes one or more heaters.

7. The oven of claim 6, wherein the one or more heaters are disposed on an internal wall of the reflow chamber.

8. The oven of claim 6, wherein the one or more heaters are disposed on an external wall of the reflow chamber.

9. The oven of claim 1, wherein the one or more channels of each wafer-support plate are connected to a heat exchanger.

10. The oven of claim 1, wherein the control system is configured to control a temperature of the hot liquid flowing through the one or more channels of each wafer-support plate.

11. The oven of claim 1, wherein the control system is configured to control a flow rate of the hot liquid flowing through the one or more channels of each wafer-support plate.

12. The oven of claim 1, wherein the first port is configured to direct at least one nitrogen, helium, or argon into the reflow chamber.

13. The oven of claim 1, wherein the second port is configured to direct formic acid vapor into the reflow chamber.

* * * * *